United States Patent [19]

Kawamura et al.

[11] Patent Number: 4,689,284

[45] Date of Patent: Aug. 25, 1987

[54] ELECTROPHOTOGRAPHIC SENSITIVE MEMBER

[75] Inventors: Takao Kawamura, Osaka; Keibun Ejima, Kagoshima; Naooki Miyamoto, Kagoshima; Hisashi Higuchi; Yasuo Nishiguchi, both of Kagoshima, all of Japan

[73] Assignees: Kyocera Corporation; Takao Kawamura, of JPX

[21] Appl. No.: 864,736

[22] Filed: May 12, 1986

Related U.S. Application Data

[63] Continuation of Ser. No. 611,366, May 16, 1984, abandoned.

[30] Foreign Application Priority Data

May 18, 1983 [JP] Japan .................................. 58-88238
May 18, 1983 [JP] Japan .................................. 58-88239

[51] Int. Cl.$^4$ ............................................. G03G 5/08
[52] U.S. Cl. ........................................ 430/84; 430/69; 430/128
[58] Field of Search .......................... 430/128, 69, 84

[56] References Cited

U.S. PATENT DOCUMENTS

4,225,222  9/1980  Kempter ........................... 430/95 X
4,405,703  9/1983  Onuma et al. ........................ 430/69

FOREIGN PATENT DOCUMENTS

0058435  4/1984  Japan .................................. 430/128
0172649  9/1984  Japan .................................. 430/128

*Primary Examiner*—John E. Kittle
*Assistant Examiner*—Mukund J. Sham
*Attorney, Agent, or Firm*—Spensley Horn Jubas & Lubitz

[57] ABSTRACT

The present invention relates to improvements in a substrate for producing an electrophotographic sensitive member having a photoconductive layer formed with amorphous silicon. An electrophotographic sensitive member, which is superior in moldability, corrosion resistance, strength, charging electric potential and the like, is formed when an aluminium material, which contains at least one of iron and manganese or a combination of each at 0.30 or less % by weight, is used as a substrate on which a photoconductive layer formed with amorphous silicon is laminated; and/or the surface roughness of said substrate is 0.5 S or less; and/or an aluminium substrate containing magnesium at 0.5 to 10.0% by weight is used.

6 Claims, No Drawings

ELECTROPHOTOGRAPHIC SENSITIVE MEMBER

This is a continuation of application Ser. No. 06/611,366 filed on May 16, 1984, now abandoned.

The present invention relates to a substrate formed with amorphous silicon for an electrophotographic sensitive member.

In recent years, various kinds of investigations about electrophotographic members comprising amorphous silicon (hereinafter referred to as a-Si) have been carried out because a-Si is superior in heat resistance, abrasion resistance, freedom from environmental pollution, photosensitive characteristics and the like.

Conventionally, materials such as Se, CdS and ZnO as well as aluminium have been largely used as photosensitive materials for production of electrophotographic sensitive members. The inventors found that a substrate formed with aluminium (hereinafter referred to as Al) had the following disadvantages:

Since the thickness of a photosensitive layer of CdS-photosensitive material and Se-photosensitive material, which is 50 to 100 μm, is comparatively large, the adhesion of a photosensitive layer to a substrate can be improved by giving the appointed roughness to the surface of an Al-substrate without deteriorating electrophotographic characteristics thereof.

An Al-material of JIS 6063 (Al—Mg—Si) has been used as a substrate for CdS-photosensitive material since it is superior in extrudability into the appointed cross section and the surface of a substrate can be satisfactorily subjected to an alumite treatment.

In general, an Al-material of JIS 3003 (Al—Mn) has been used as a substrate for Se-photosensitive material since an Al-substrate satisfactorily matches the Se-layer, thereby producing no change in electrophotographic characteristics.

On the contrary, it was found that minute defects produced on the surface of a substrate gave an influence upon a photosensitive layer, thereby deteriorating electrophotographic characteristics thereof since the thickness of a photosensitive layer of a-Si photosensitive material, which was 20 to 30 μm, is remarkably small.

Further, although Al-materials generally contain impurities of iron (Fe), it is desired that a substrate for a-Si photosensitive material be superior in properties such as moldability, corrosion resistance, strength, machinability and hardness.

However, it was found that since solid solutions were not produced between Fe or Mn and Al and were separated in the form of sediment, thereby producing a compact distribution of sediments having a size of several μm on the surface of a substrate made of Al materials, even though a mirror surface was produced by grinding by means of machines such as ultra-precision lathe, protrusions, which grew to a size of several ten μm with said sediments as nuclei, were formed in the case when an a-Si layer was formed on said Al-substrate by means of glow discharge decomposition technique or the like.

As a result, it was observed that charge-holding capability was reduced with said protrusions as centers, thereby preventing the toner from being adhered, producing white-removed spots on a copied image, the deterioration of characteristics continuing during repeated use, gradually increasing said white-removed spots.

The present invention was achieved with respect to the above described circumstances. It is a primary object of the present invention to provide an ideal electrophotographic sensitive member in which the content of Mn in addition to Fe is reduced to reduce the amount of sediments consisting of them and Al to the utmost while effectively keeping the characteristics of Mn, such as superior moldability and corrosion resistance, thereby producing no white-removed spots and increasing a charge-electric potential.

In short, it is a point of the first embodiment to provide an electrophotographic sensitive member comprising at least an a-Si photoconductive layer laminated on a substrate primarily made of Al, characterized in that said substrate contains at least one of Fe and Mn or a combination thereof at 0.30% by weight and the surface roughness of said substrate is preferably 0.5S or less, the protrusions being hardly produced since at least one of Fe and Mn is contained at 0.30% by weight, and the charge-electric potential being increased since the surface roughness of said Al-substrate is 0.5S or less.

It was, however, found that minute concave portions and convex portions were produced on the surface of a substrate when said substrate was heated to temperatures over 200° C. in glow discharge decomposition technique even though said substrate was ground by means of machines, such as the above described ultra-precision lathe, to give a seemingly uniform and nicely shaped layer, thereby producing both striped patterns on an a Si photosensitive material and corresponding white-striped patterns on a copied image.

Accordingly, the inventors completed the following second embodiment as a result of the investigations aimed at the solution of the above described disadvantages.

That is to say, it is an object of the second embodiment to provide an electrophotographic sensitive member superior in reproducibility and fidelity in which the content of Fe and Mn is effectively reduced to reduce the amount of sediments thereby producing no white-removed spots on a copied image, increasing the charge electric potential, preventing minute concave portions and convex portions on the surface of a substrate to the utmost, and producing no white-striped patterns.

In short, it is a point of the second embodiment to provide electrophotographic sensitive member comprising at least a-Si photoconductive layer laminated on a substrate primarily made of Al, characterized in that said substrate contains magnesium (Mg) at 0.5 to 10.0% by weight.

The present invention will be in detail described below with reference to the preferred embodiments.

Although an Al-substrate is manufactured from various kinds of Al-material in accordance with JIS, it is desirable used in Al-materials for producing a-Si photosensitive material that the deterioration of electric characteristics, such as an increase of residual electric potential and the change in quality of the surface of a substrate, leading to a decrease of the adherence of a-Si film are difficultly produced in addition to having superior machinability, superior corrosion resistance and easy production of mirror surface. In addition, it is desirable that a substrate keep its strength to some extent and the deformation and defects of the surface of a substrate be difficultly produced. The above described characteristics are dependent upon the kind and content of impurities such as Si, Fe, Cu, Mn, Mg, Zn, Cr, Ti and Ni contained in Al.

While investigating various kinds of Al-materials provided in JIS, it was found that Al-material, of which composition was shown in Table 1, of JIS 1070, effectively kept the above described characteristics, such as corrosion resistance, strength, hardness and deterioration of surface, in spite of a comparatively small content of Fe and Mn. The frequency of sediments was measured while changing the content of Fe and Mn in this Al-material as shown in Table 2.

This frequency of sediments was determined from the mean number of protrusions having a size of more than 50 μmφ per 100 cm² observed for sediments produced on the surface of a substrate after a mirror-surface treatment by means of ultra-precision lathe using a diamond cutting tool and glow discharge decomposition by a stereomicroscope at a magnification of 40 was conducted.

TABLE 1

| JIS mark | Chemical composition (% by weight) | | | | | | |
|---|---|---|---|---|---|---|---|
| | Si | Fe | Cu | Mn | Mg | Zn | Ti |
| 1070 | <20 | <0.25 | <0.04 | <0.03 | <0.03 | <0.04 | <0.03 |

If the total content of Fe and Mn is reduced to 0.30% by weight or less while conforming to the above described chemical composition, the number of protrusions is remarkably reduced thereby increasing a charge-holding capability. Simultaneously it was observed that the charge-holding capability tended to increase with a decrease of the surface roughness of an Al-substrate. It was found by the inventors that the charge-holding capability was further increased if the surface roughness was reduced to 0.5S or less, preferably 0.1S or less.

Accordingly, the above described various kinds of Al-substrates were variously subjected to a mirror-surface treatment and the resulting Al-substrate was sequentially covered with an a-Si barrier layer, an a-Si photoconductive layer and an a-Si surface protective layer by employing a capacitive coupling type glow discharge decomposition apparatus. The resulting electrophotographic sensitive members were tested on charge electric potential characteristics. The results are shown in Table 2.

TABLE 2

| Sample No. | Chemical composition (% by weight) | | Surface roughness (S) | Mean number of protrusions | Charge electric potential (V) |
|---|---|---|---|---|---|
| | Fe | Mn | | | |
| 1 | 0.03 | 0.02 | 0.05 | 0.1 | 820 |
| 2 | 0.05 | 0.01 | 0.1 | 0.4 | 780 |
| 3 | 0.02 | 0.03 | 0.4 | 0.8 | 700 |
| ***4 | 0.00 | 0.20 | 0.1 | 0.8 | 750 |
| ***5 | 0.25 | 0.00 | 0.1 | 1.0 | 750 |
| ***6 | 0.00 | 0.00 | 0.1 | 0.1 | 760 |
| **7 | 0.03 | 0.01 | 1.0 | 1.0 | 530 |
| 8 | 0.25 | 0.01 | 0.05 | 0.4 | 750 |
| 9 | 0.02 | 0.23 | 0.05 | 0.6 | 780 |
| *10 | 0.40 | 0.02 | 0.1 | 5.5 | 750 |
| *11 | 0.02 | 0.50 | 0.1 | 18.2 | 760 |
| *12 | 0.25 | 0.30 | 0.3 | 23.0 | 730 |
| 13 | 0.10 | 0.15 | 0.1 | 1.2 | 760 |
| 14 | 0.20 | 0.09 | 0.2 | 1.5 | 740 |
| *15 | 1.00 | 0.70 | 0.5 | 50.6 | 700 |
| **16 | 0.02 | 0.03 | 0.7 | 0.8 | 550 |
| **17 | 0.25 | 0.01 | 2.0 | 1.5 | 500 |
| **18 | 0.02 | 0.23 | 5.0 | 2.0 | 420 |

*The sample Nos. marked with * show an electrophotographic sensitive member of which total content of Fe and Mn is outside the range according to the present invention.
The sample Nos. marked with  show an electrophotographic sensitive member in which surface roughness is outside the range according to the present invention.
*Although the content of Fe and Mn is 0.00 in the sample marked with *, it contains Fe and Mn, which are inevitable impurities even in the purification of the highest degree, at a % by weight of at least 0.001

That is to say, the barrier layer contains oxygen in a progressively decreasing pattern throughout the formation thereof, containing oxygen at about 5.0 atomic %, boron at about 200 ppm and hydrogen at about 10 atomic % at the start point of the layer formation, and oxygen at about 0.02%, at a layer thickness of 2.0 μm. Then an a-Si photoconductive layer 21.8 μm thick containing oxygen at about 0.02 atomic %, boron at about 200 ppm and hydrogen at about 15 atomic % was laminated on said a-Si barrier layer. Subsequently, an a-Si surface protective layer 0.2 μm thick having oxygen in a progressively increasing pattern throughout the formation thereof, containing oxygen at about 50 atomic %, hydrogen at about 15 atomic % and containing no boron at the final point of the layer formation was formed on said a-Si photoconductive layer.

The thus obtained built-up electrophotographic sensitive member was positively charged with a corona charge of +5.6 kV and the charge electric potential of the surface thereof was measured.

As obvious from Table 2, it was clearly observed that the mean number of protrusions was remarkably increased in the sample Nos. 10, 11, 12, 15 since the total content of Fe and Mn was over 0.30% by weight and an a-Si electrophotographic sensitive member using these substrates therein produced remarkable white-removed spots on a copied image. On the contrary, it was observed that the number of protrusions was extremely decreased in the sample Nos. 1 to 9, 13, 14, 16 to 18, and an a-Si electrophotographic sensitive member using these substrates did not produce white-removed spots on a copied image at all.

In addition, although the addition of Fe and Mn has a great influence upon the surface roughness and the latter tends to increase with an increase of the former, it was found from the results shown in Table 2 that a charge electric potential was remarkably reduced in the cases when the surface roughness was over 0.5S, such as the sample Nos. 7, 16 to 18. The mean number of protrusions was additionally decreased, the above described white-removed spots were not produced, and the charge electric potential was increased, thereby creating an ideal electrophotographic sensitive member in the cases when the total content of Fe and Mn was 0.30% by weight or less and the surface roughness was 0.5S or less, preferably 0.1S or less such as the sample Nos. 1 to 6, 8, 9, 13, 14.

Further, the reduction of an amount of Fe and Mn added hardly have an influence upon the characteristics such as moldability, corrosion resistance and strength resulting from the inclusion of Mn in the practical use of the samples (sample Nos. 1 to 9, 13, 14, 16 to 18, in which the total content of Fe and Mn was 0.30% by weight or less, described in this preferred embodiment.

As is obvious from the above described preferred embodiment, it was found that an a-Si electrophotographic sensitive member using a substrate made of Al-materials therein did not show any deterioration in characteristics if the total content of Fe and Mn was 0.30% by weight or less even though they formed sediments and the charge electric potential was remarkably increased if it was ground so that its surface roughness might be 0.5S or less, thereby creating a superior electrophotographic sensitive member.

Further, it was found from the inventors' additional investigation that an Al-substrate made of the above used Al-materials of JIS 1070 did not produce minute concave portions and convex portions at all on the surface thereof in the glow discharge at temperatures thereof up to 200° C., but produced minute concave portions and convex portions on the surface thereof if the temperatures thereof were over 200° C. in order to form the layers particularly fast. It is the reason of the above described that minute surface strain layers resulting from machining of a substrate are produced. That is to say, a mirror surface is formed by means of a diamond cutting tool being engaged with the circumference of a rotating drum and being fed in the longitudinal direction of said drum, and surface strain layers are apt to be produced when soft materials are machined. In short, the parts, which are periodically crushed and shaped by a diamond cutting tool in the feed direction thereof, are produced and the layers having large strains are produced in these parts. An internal stress is procuced in these strain layers. Although the deformation is not produced at substrate temperatures of about 200° C., minute concave and convex deformations are produced on the surface of a substrate at substrate temperatures over 200° C. since said internal stresses are released in the form of heat.

It was also found from the further additional inventors' investigation that Al-materials of JIS 5000 are remarkably superior in this respect. These Al-materials are those of aluminium-magnesium type and moldability, machinability, corrosion resistance and the like thereof are remarkably improved by adding magnesium (Mg). In addition, a substrate made of these Al-materials does not produce minute concave portions and convex portions on the surface thereof in the glow discharge even though the substrate temperature is over 200° C. These Al-materials do not show an improvement in machinability, do not produce striped patterns on an a-Si electrophotographic sensitive member comprising a substrate made of such Al-materials, and no white-striped patterns are produced on a copied image at the Mg-content less than 0.5% by weight. In addition, corrosion resistance, charge electric potential, adherence of an a-Si layer and the like are deteriorated at the Mg-content over 10.0% by weight. Accordingly, the Mg-content of such Al-materials is preferably 2.0 to 5.0% by weight.

Further, the second embodiment of the present invention is characterized in that non-heat treated type Al—Mg alloys are processed into drum-like shapes by the cold hardening treatment.

Accordingly, the cold hardening phenomenon is produced thereby being capable of improving an Al-substrate in hardness and strength.

It was confirmed by various kinds of inventors' experiment that the hardness ($H_B$) over 70 and the tensile strength over 25 kg/mm$^2$ could be achieved, thereby creating an even and glossy finished surface superior in machinability.

On the contrary, it was also found that dendritic or flaky patterns, scratches and the like tended to form during the machining process of an Al-substrate by means of a cutting tool, the stabilized machining conditions were not secured, and the manufacturing yield of an Al-substrate was remarkably reduced.

The preferred embodiment 2, in which Al-materials of JIS 5086, having the chemical composition shown in Table 3, will be described below.

Table 3 shows the chemical composition standard of Al-materials of JIS 5086.

TABLE 3

| JIS mark | Chemical composition (% by weight) | | | | | | | |
|---|---|---|---|---|---|---|---|---|
| | Si | Fe | Cu | Mn | Mg | Zn | Cr | Ti |
| 5086 | <0.40 | <0.50 | <0.10 | 0.2~0.7 | 3.5~4.5 | <0.25 | 0.05~0.25 | <0.15 |

The Mg-content of Al-materials of JIS 5086 was variously changed while effectively keeping the characteristics of Al-materials, such as corrosion resistance, strength, hardness and deterioration resistance of the surface, even though the total content of Fe and Mn was remarkably reduced since it was large in Al-materials of JIS 5086, as shown in Table 4. The frequency of sediments was measured and the change of substrate surface in the heating process at about 250° C. for 3 to 10 hours by a glow discharge technique was observed. The results were classified into three ranks with corrosion resistance, charge electric potential, adherence of an a-Si layer and the like as the evaluation standards. The O mark shows an excellent electrophotographic sensitive member which does not produce minute concave portions and convex portions on the surface of a substrate at all, does not produce striped patterns on an a-Si photosensitive material at all thereby not producing white-striped patterns on a copied image and showing no deterioration in corrosion resistance, charge electric potential, or adherence of an a-Si layer and the like. The Δ mark shows an electrophotographic sensitive member which does not show deterioration in corrosion resistance, charge electric potential, adherence of an a-Si layer or the like but slightly produces striped patterns on an a-Si photosensitive material, thereby slightly producing white-striped patterns also on a copied image. The ▲ mark shows an electrophotographic sensitive member which does not produce minute concave portions or convex portions on the surface of a substrate or striped patterns on an a-Si photosensitive material, thereby producing no white-striped patterns on a copied image, but slightly shows deterioration in corrosion resistance, charge electric potential, adherence of an a-Si layer and the like. The X mark shows a practically unusable electrophotographic sensitive member which produces minute concave portions and convex portions on the surface of a substrate and striped patterns on an a-Si photosensitive material, thereby producing white-striped patterns on a copied image and remarkably shows deterioration in corrosion resistance, charge electric potential, adherence of an a-Si layer and the like.

In addition, the frequency of sediments was determined from the mean number of protrusions having a size of more than 50 μmϕ per 100 cm² observed for sediments produced on the surface of a substrate after mirror-surface treatment by means of an ultraprecision lathe using a diamond cutting tool and glow discharge decomposition by a stereomicroscope at a magnification of 40.

TABLE 4

| Sample No. | Chemical composition (% by weight) | | | Mean number of protrusions | evaluation of substrate surface |
|---|---|---|---|---|---|
| | Fe | Mn | Mg | | |
| 1 | 0.03 | 0.02 | 0.50 | 0.2 | ○ |
| 2 | 0.02 | 0.03 | 1.20 | 0.5 | ○ |
| 3 | 0.05 | 0.01 | 3.50 | 1.0 | ○ |
| **4 | 0.25 | 0.10 | 6.00 | 23.0 | ○ |
| 5 | 0.07 | 0.05 | 9.40 | 1.2 | ○ |
| *6 | 0.02 | 0.03 | 0.30 | 0.8 | △ |
| *7 | 0.05 | 0.01 | 0.05 | 0.6 | X |
| *8 | 0.07 | 0.05 | 15.00 | 0.9 | ▲ |
| 9 | 0.10 | 0.15 | 3.00 | 1.2 | ○ |
| **10 | 0.25 | 0.30 | 4.20 | 25.0 | ○ |
| 11 | 0.25 | 0.01 | 3.00 | 0.5 | ○ |
| 12 | 0.02 | 0.23 | 9.40 | 0.6 | ○ |
| *13 | 0.10 | 0.15 | 0.01 | 1.2 | X |
| *14 | 0.07 | 0.05 | 0.10 | 1.0 | △ |
| *15 | 1.00 | 0.70 | 0.05 | 55.0 | X |
| *16 | 0.00 | 0.00 | 0.30 | 0.1 | △ |
| 17 | 0.00 | 0.00 | 4.00 | 0.1 | ○ |
| 18 | 0.00 | 0.00 | 7.00 | 0.1 | ○ |
| 19 | 0.00 | 0.10 | 3.00 | 1.0 | ○ |
| *20 | 0.20 | 0.00 | 0.30 | 1.5 | △ |
| 21 | 0.20 | 0.00 | 4.00 | 1.2 | ○ |
| 22 | 0.20 | 0.00 | 7.00 | 1.5 | ○ |

*Sample Nos. marked with * show an electrophotographic sensitive member in which contents of Fe, Mn and Mg are outside the range according to the present invention.
Sample Nos. marked with  show an electrophotographic sensitive member in which evaluation of the substrate surface is within range according to the present invention but the mean number of protrusions is remarkably large, thereby producing a problem in the practical use thereof.

In addition, the content of Fe and Mn of 0.00 shows that Fe and Mn, which are inevitable impurities even in the purification of the highest degree, are contained at at least 0.001% by weight, respectively.

As is obvious from Table 4, minute concave portions and convex portions are not produced on the surface of a substrate and striped patterns are not produced on an a-Si photosensitive material in sample Nos. 1 to 5, 9 to 12, 17 to 19, 21 and 22. In particular, the influence of sediments formed from Fe and Mn is small, the mean number of protrusions is small, and therefore white-striped patterns are not produced on a copied image, and also white-removed spots are not observed in the sample Nos. 1 to 3, 5, 9, 11, 12, 17 to 19, 21 and 22.

On the contrary, striped patterns were slightly produced on an a-Si electrophotographic sensitive member and white-striped patterns were produced also on a copied image in the sample Nos. 6, 14, 16, 20. In addition, the deterioration in corrosion resistance, charge electric potential, adherence of an a-Si layer and the like was slightly observed in the sample No. 8, thereby providing a hindrance in the practical use since the Mg-content was large. Minute concave portions and convex portions were produced on the surface of the substrate, striped patterns were produced on the a-Si electrophotographic sensitive member using said substrate therein, white-striped patterns were produced on the copied image, and deterioration in corrosion resistance, machinability, moldability and the like were observed in sample Nos. 7, 13, 15, since the Mg-content was remarkably small. That is to say, they were unsuitable with a substrate of an a-Si electrophotographic sensitive member.

As obvious from the above described preferred embodiment, in the case when a substrate made of Al-materials was used for manufacturing an a-Si electrophotographic sensitive member, the Mg-content of 0.5 to 10.0% by weight led to not only an improvement in machinability but also the provision of a substrate for an a-Si electrophotographic sensitive member superior in also moldability, corrosion resistance and the like. In addition, the total content of Fe and Mn of 0.30% by weight or less led to the provision of a substrate having a small number of protrusions on the surface thereof, thereby capable of providing an electrophotographic sensitive member having excellent producibility.

What is claimed is:

1. An electrophotographic sensitive member comprising a substrate made primarily of aluminum and an amorphous silicon photoconductive layer laminated to a first surface thereof, said substrate further including a constituent selected from the group consisting of iron, manganese and mixtures thereof in an amount greater than zero and not greater than approximately 0.30 percent of total composition weight.

2. An electrophotographic sensitive member according to claim 1 wherein the first surface of said substrate has a roughness greater than zero and not greater than approximately 0.5S.

3. An electrophotographic sensitive member comprising a substrate made primarily of aluminum and an amorphous silicon photoconductive layer laminated to a first surface thereof, said substrate further including magnesium as a constituent in an amount of approximately 0.5 to 10.0 weight %.

4. An electrophotographic sensitive member according to claim 3 wherein said substrate further comprises a member selected from the group consisting of iron, manganese, and mixtures thereof in an amount greater than zero and not greater than 0.30 percent of total composition weight.

5. An electrophotographic sensitive member comprising a substrate consisting essentially of aluminum and a constituent selected from the group consisting of iron, manganese, and mixtures thereof in an amount greater than zero and not greater than approximately 0.30 percent of total composition weight, and an amorphous silicon photoconductive layer laminated to a first surface of said substrate.

6. An electrophotographic sensitive member comprising a substrate consisting essentially of alumium and including magnesium in an amount of approximately 0.5 to 10.0 percent of total composition weight, and an amorphous silicon photoconductive layer laminated to a first surface of said substrate.

* * * * *